United States Patent [19]

Enabnit

[11] 4,017,826

[45] Apr. 12, 1977

[54] METHOD AND APPARATUS FOR EXTENDING THE OPERATING RANGE OF A CONDITION MONITORING SYSTEM

[75] Inventor: Robert S. Enabnit, Akron, Ohio

[73] Assignee: The Goodyear Tire & Rubber Company, Akron, Ohio

[22] Filed: Sept. 24, 1975

[21] Appl. No.: 616,120

[52] U.S. Cl. .............................. 340/58; 340/259; 330/26; 73/146.5
[51] Int. Cl.² ........................................ B60C 23/02
[58] Field of Search ............... 340/52 R, 58, 52 F, 340/52 R, 71, 73, 74, 259; 330/1 R, 26; 73/146.5

[56] References Cited

UNITED STATES PATENTS

| 3,665,387 | 5/1972 | Enabnit | 340/58 |
| 3,831,161 | 8/1974 | Enabnit | 340/259 |

Primary Examiner—Alvin H. Waring
Attorney, Agent, or Firm—F. W. Brunner; L. A. Germain

[57] ABSTRACT

Apparatus and method for extending the operating range of a condition monitoring system that detects the occurrence of an abnormal condition on a first member moving relative to a second member; the system including a sensor circuit on the first member adapted to be responsive to the condition being monitored and a monitoring circuit on the second member adapted to being affected by the proximate presence of a close-circuited sensor circuit to provide detection signals to circuit means for indicating the condition of the moving member indicative of the open or close-circuited sensor circuit. The system is characterized by a monitoring circuit operating at the threshold of an oscillatory and nonoscillatory state and a close-circuited sensor circuit configuration that affects the monitoring circuit irrespective of its operational state.

12 Claims, 8 Drawing Figures

METHOD AND APPARATUS FOR EXTENDING THE OPERATING RANGE OF A CONDITION MONITORING SYSTEM

BACKGROUND OF THE INVENTION

This invention generally relates to monitoring a condition occurrence on a first member moving relative to a second member. More specifically, the invention provides a method and apparatus for improving and/or extending the operating range of an electronic monitoring device such that the changes attributed to temperature, amplification, component values, circuit parameters, initial adjustments, and environmental influences have a minor effect on the ability of the device to operate in its intended application.

There are many and various prior art devices, both simple and sophisticated, that are adapted for the detection of a condition occurrence. These devices are, for the most part, electronically oriented and include a circuit configuration that is adapted to be responsive to the condition occurrence being monitored. In applications involving moving members, it is common practice to utilize the effect of interacting inductances so that physical connections are not required between the sensing circuit on the moving member and the monitoring circuit on the stationary member. Further, it is the practice to establish an operating mode for the monitoring circuit such that the moving member, in its normal condition, has either no interacting effect on the monitoring circuit, or alternately has a marked effect on the monitoring circuit. In either case, there is established in the monitoring circuit, an operating mode or range within which the circuit must operate dictated by the distance between the sensing circuit and the monitoring circuit and/or by the particular circuit, its parameters, and the effect of influences other than the effect attributed to the sensing circuit.

Examples of condition monitoring devices of the type alluded to are found in vehicle tire monitoring systems, conveyor belt rip detection systems and the like. In these type applications, inductive coils are mounted on the wheel or belt in a normally open-circuited or close-circuited state such that an abnormal condition occurrence will effectively change the coil status to its alternate close-circuited or open-circuited state respectively. This change in the sensor coil state due to the condition occurrence on the moving member is used to alter the normal operating status of the monitoring circuit when it passes proximate thereto. This may be accomplished by decoupling a pair of mutually coupled coils associated with an oscillator in the monitoring circuit to interrupt an oscillatory signal, or alternately, to provide coupling of the coils such that a nonoscillatory circuit creates an oscillatory signal. Further, this may be accomplished by increasing or decreasing coupling between inductances to establish an oscillatory or nonoscillatory state respectively. Other variations of this general theme are possible and may be found by reference to prior art patents in the field and to the literature.

While these prior art monitoring systems are basically of sound design, it has been found that, in attempting to apply the devices to the extremely harsh environments of vehicle tire and industrial belt monitoring applications in a miniaturized configuration, various influences tend to alter the operating characteristics of the circuitry and otherwise cause instability and/or erratic operation.

For example, FIG. 1 is a graphical illustration of the operation of a circuit configuration that is adapted to operate in an oscillatory mode. In the drawing, the ordinate of the graph represents change in the functional characteristics ($\Delta F$) of the circuit due to amplification, temperature, component aging, environment and other influences and $F_1$ and $F_2$ are the limits established for the circuit in its design for a particular application. An oscillatory circuit is generally defined as a feedback circuit in which the output is coupled back to the input in the proper phase and magnitude to sustain oscillation. In this respect, therefore, the graph illustrates the boundary $F_b$ for the feedback condition wherein the circuit is either an oscillator or a nonoscillator and the shaded area of the graph illustrates the bounded area in which the circuit functional characteristics and the feedback are right for the circuit to operate as an oscillator. Of course it should be understood that the graph is representative of a circuit having a particular combination of operational parameters and that the change in state boundary $F_b$ will vary according to the variance in the circuit parameters. The abscissa or X-axis of the graph represents the other boundary of the effective region of oscillation. To illustrate how the graph is used to describe an oscillatory circuit including an inductive feedback circuit wherein the positive X-axis may be representative of decreasing M, the mutual coupling of the feedback energy, it will be assumed that a particular circuit is configured to operate within the range $F_1$ and $F_2$ and that coupling $M_o$ is that minimum coupling which will maintain the oscillatory state of the circuit for a $\Delta F$ between $F_1$ and $F_2$. As shown by the graph, the circuit operation is within the shaded area and will continue to operate in an oscillatory mode only as long as $\Delta F$ does not exceed $F_1$ or $F_2$ by an amount to move point $P_o$ outside of the boundaries. Similarly, for a $\Delta F$ less than $F_2$ the mutual coupling $M_o$ may decrease and still maintain the circuit in an oscillatory operational mode. To illustrate by way of an example, should $\Delta F$ change to $F_3$, then for the same $M_o$ the circuit operating point is moved to $P_3$ and the circuit no longer functions as an oscillator. In order to bring operation back within the bounded area, the mutual coupling must be increased to $M_3$ and the circuit will resume its oscillatory mode of operation. This discussion presumes that the feedback coupling is a function of the mutual coupling between a pair of inductances ($L_1, L_2$) in the circuit designated the monitoring circuit; however, if the separation of these inductances is a constant, then the coupling may be a function of a separate influence, i.e., a tertiary circuit including an inductance $L_3$ in proximate position to $L_1L_2$ such that the oscillatory operating mode of the primary or monitoring circuit is affected. If, in this circumstance, a negative feedback coupling is associated with the proximity of $L_3$, the effective mutual coupling M is decreased. A decrease in mutual coupling of $\Delta M$ or more (indicated by the cross-hatched area) will result in a change of state from oscillatory to nonoscillatory along the boundary $F_b$. If, however, the operational conditions should change such that $\Delta F$ is effective to move point $P_o$ to the left toward $P'$, then the circuit no longer can change state with a decrease in coupling provided by $L_3$ and it would require closer proximity of $L_3$ to provide a greater coupling change $\Delta M$ over the new parameter range.

A similar graphical illustration may be used to demonstrate the operation of a nonoscillatory circuit configuration. Referencing FIG. 2, it should be clear from the above discussion with respect to the oscillatory circuit of FIG. 1 that a nonoscillatory circuit, operating in the shaded area of FIG. 2, may revert to an oscillatory mode by reason of the change in circuit functional characteristics $\Delta F$ to put the operation outside of the $F_b'$ boundary and the X-axis. For example, a change in circuit parameters beyond the range of $F_1$ or $F_2$, such as indicated at $F_3$, will result in the operating point moving to $P_3'$ and the initial coupling between $L_1 L_2$ (at $M_o'$) will have to be decreased to $M_3'$ for satisfactory nonoscillatory operation. When a tertiary circuit including an inductance $L_3$ is operating to provide increased or positive feedback coupling $\Delta M'$ between $L_1$ and $L_2$, a change of state from nonoscillating to oscillating is initiated as defined by the $F_b'$ boundary and within the limits $F_1$ and $F_2$.

It should be apparent from this discussion that the operating mode of the monitoring circuit, whether oscillatory or nonoscillatory is a function of a plurality of operational characteristics that establish limits in its operation. It is therefore an object of this invention to provide a method and apparatus for extending the operating range of a condition monitoring system by establishing sensor and monitoring circuit configurations that operate over a broader range of circuit functional characteristics.

It is a further object of the invention to provide a monitoring system configuration that provides an output signal indicative of the sensed condition upon the proximate passage of a closed-circuited sensor circuit regardless of the initial oscillatory or nonoscillatory state of the monitoring circuit. These objects are accomplished in a monitoring system adapted for sensing and indicating the occurrence of a change in condition of a first member moving relative to a second member comprising: circuit means on the second member responsive to a signal at its input to provide signal conditioning and an indication of the normal and/or abnormal condition of the first member; a monitoring circuit on the second member comprising an amplifier having input and output inductances, the configuration of the amplifier being such that it is at a threshold of one or the other of two operational states, the first state being such that the operational parameters of the circuit influence regenerative feedback over degenerative feedback and the amplifier oscillates while the second state is such that the operational parameters of the circuit influence degenerative feedback over regenerative feedback and the amplifier does not oscillate, said monitoring circuit coupled to the circuit means to provide a signal that will influence the status of the circuit means for indicating the change in condition; and an inductive sensor circuit on the first member, movable therewith and responsive to the occurrence of a change in the condition of the first member, said sensor circuit being in a configuration to provide intercoupling of the amplifier input and output inductances when close-circuited and in proximate position thereto such that a signal is generated in the monitoring circuit regardless of its current oscillatory or nonoscillatory operational state.

DESCRIPTION OF THE DRAWINGS

The features and advantages of the invention will be better understood from a consideration of the following description taken in conjunction with the accompanying drawings in which.

BRIEF DESCRIPTION OF THE INVENTION

Figure 3:
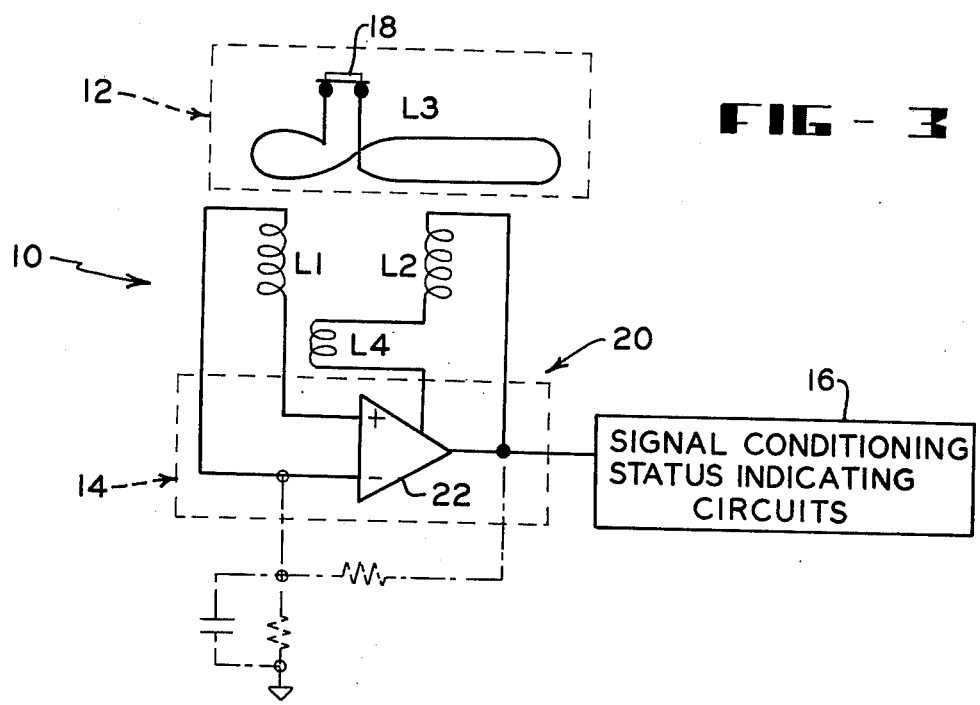
FIG. 3 is a general circuit diagram of a condition monitoring system including a monitoring circuit that may operate in either an oscillatory or nonoscillatory mode and a sensing circuit configuration adapted to effect a detection output signal from the monitoring circuit regardless of its operating mode.
Figure 4:
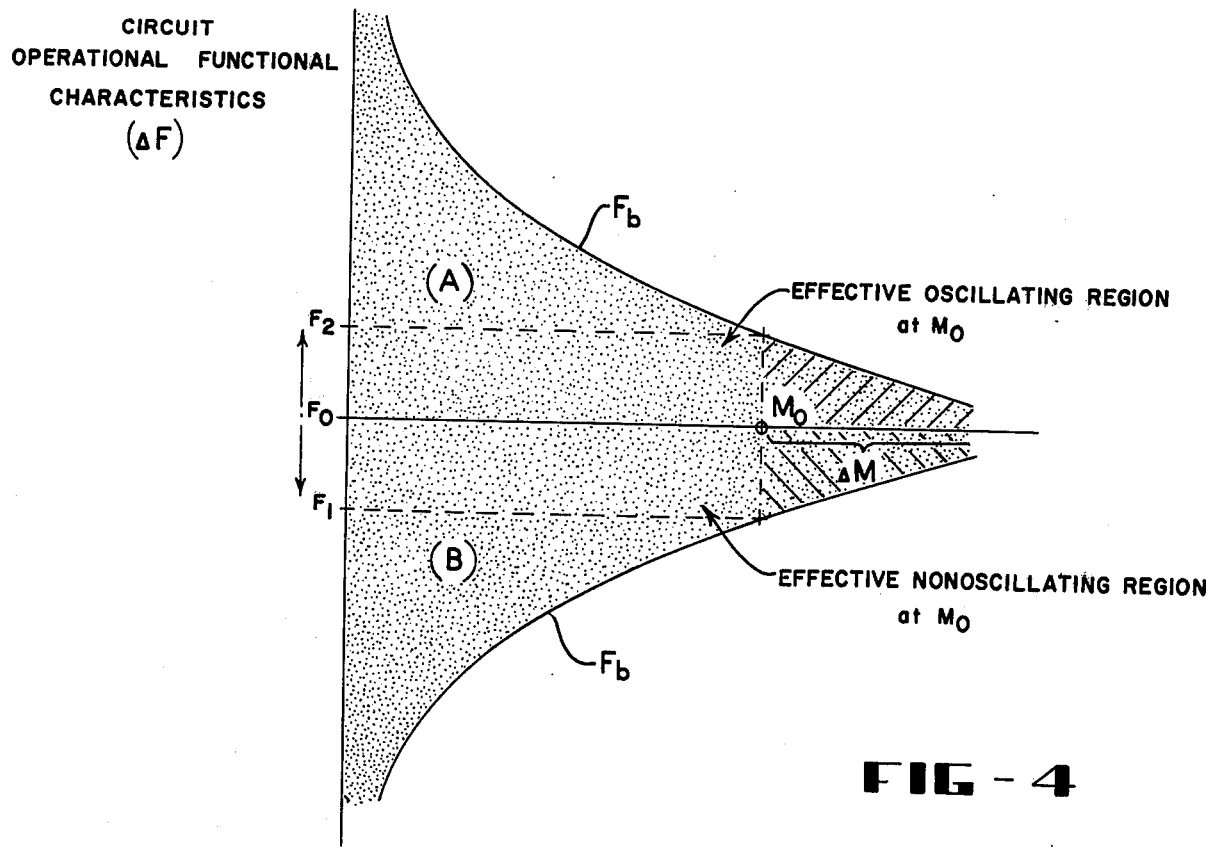
FIG. 4 is a graphical illustration describing the mode of operation of the system illustrated in FIG. 3.

Referring to FIGS. 3 and 4, a condition monitoring system is generally indicated by reference number 10. The system is adapted for monitoring a condition occurrence on a first member 12 moving relative to a second member 14 to provide a signal to conditioning and status indicating circuits 16 indicative of the monitored condition.

The first member 12 has an inductive loop $L_3$ mounted thereon in series with a condition responsive switch 18. The member 12 may be in the form of a vehicle wheel wherein the switch 18 comprises a pressure or temperature responsive element adapted for being open-circuited or close-circuited upon the occurrence of a change in the condition being monitored. The member 12 may also be in the form of a conveyor belt wherein the switch 18 comprises a conductive wire loop mounted on the belt and adapted to being open-circuited or close-circuited upon the occurrence of a longitudinal rip or tear in the belt. Naturally, the member 12 may take on many and various forms and the invention is not considered limited thereto or thereby but only by the scope of the appended claims.

Figure 1:
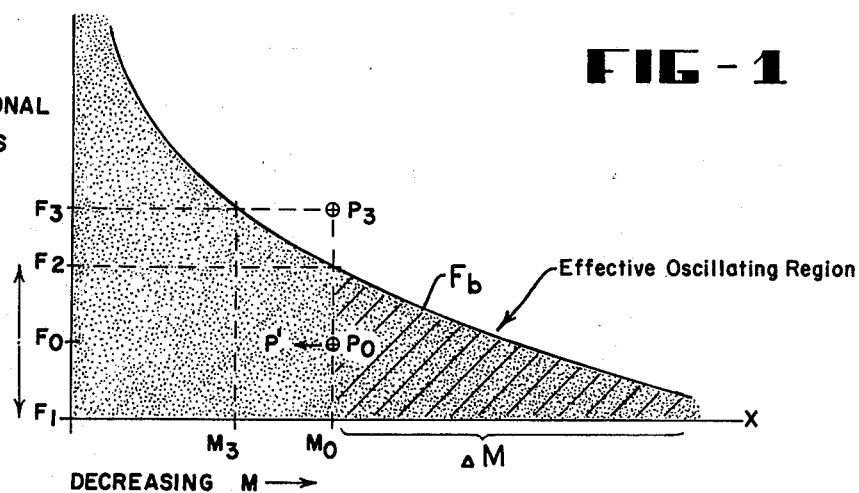
FIG. 1 is a graphical illustration describing the mode of operation of a typical oscillatory circuit.
Figure 2:
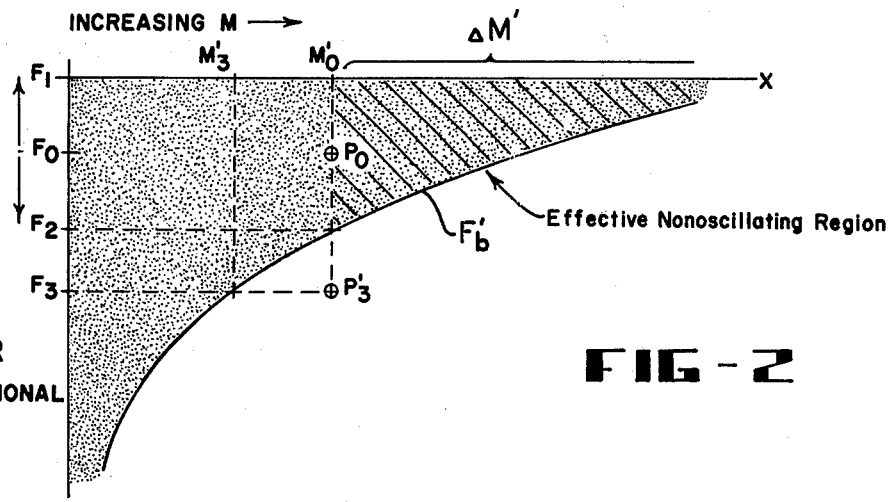
FIG. 2 is a graphical illustration describing the mode of operation of a typical nonoscillatory circuit.

To continue, the monitoring system also comprises a monitoring circuit 20 mounted on the second member 14 that includes an inductive feedback circuit comprising coils $L_1$ and $L_2$. The monitoring circuit 20 is essentially an amplifier 22 with input and output inductors $L_1$ and $L_2$ respectively. The operational characteristics are established for the monitoring circuit in the absence of the sensing circuit including $L_3$ by reason of a small coupling inductor $L_4$ such that the amplifier is at a threshold of either of two operational states. More specifically, the component values of resistance, capacitance, and inductance, and the configuration of the circuit 20 are so chosen that the circuit may be tentatively in either an oscillatory or a nonoscillatory state. It is widely recognized that in such a circuit, loop coupling, hence spacing of the inductors, is a function of amplification and therefore is temperature dependent. Referring to FIG. 4, the monitoring circuit 20 is operationally established at $F_o$ which is the threshold between an oscillatory state A and a nonoscillatory state B. FIG. 4, in essence, illustrates the combined operational characteristics herebefore discussed with respect to FIGS. 1 and 2 and therefore the X-axis becomes the boundary state line between a circuit operating as an oscillator in region A and one operating as a nonoscillator in region B. The particular state of the circuit depends upon the change in the circuit operational/functional characteristics represented by the ordinate of the graph and the feedback coupling boundary $F_b$. The operational/functional changes may be due to temperature, component values, overall circuit parameters, initial adjustments, and environmental influences that are exemplified as a change in amplification and/or hence loop coupling which establishes the circuit operation in one or the other operational state. In short, the monitoring circuit may revert to an oscillator operating in region A, or as in region B to simply a nonoscillating amplifier with input and output inductances.

Continuing with reference to FIG. 4, it should now be apparent that the invention is a marked improvement over the prior art by reason of the expanded operating region covered by the shaded area. Because the monitoring circuit may operate in either of the regions A or B, the allowable $\Delta F$ is greatly expanded and less change in coupling $\Delta M$ is required for altering the operational state over a particular parameter range. This means that the useful separation of the tertiary circuit $L_3$ from $L_1L_2$ may be increased. Furthermore, it will become apparent to those persons knowledgeable and skilled in the electronics arts that the complete diagram of FIG. 4 may be moved vertically in either direction to cover many and various circuit configurations.

In order for the monitoring circuit 20 to effectively function in its intended application, the sensing circuit on the movable member must be capable of providing a detectable effect regardless of which oscillatory state the monitoring circuit happens to be in. In this circumstance, a close-circuited inductive loop $L_3$ is configured to affect the mutual coupling that exists between $L_1$ and $L_2$ when the monitoring circuit is oscillating by reverse coupling the coils $L_1L_2$ such that the oscillatory signal is interrupted and a modulation pulse may be distinguished. By the same token, the $L_3$ configuration also effects coupling between $L_1$ and $L_2$ when the circuit is in a nonoscillatory state and insufficient mutual coupling exists such that again a modulation pulse may be distinguished. In either situation, therefore, the coil $L_3$ affects the monitoring circuit 20 each time it passes proximate thereto in a close-circuited condition regardless of the oscillatory or nonoscillatory state of the monitoring circuit. Neither condition is affected by an open-circuited $L_3$.

Figure 6A:
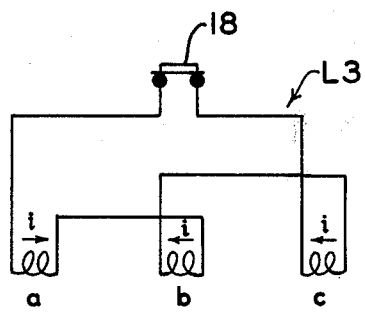
FIGS. 6A and 6B are schematic and pictorial circuit diagrams respectively of the $L_3$ inductance that is associated with the movable member shown in FIG. 3.
Figure 6B:
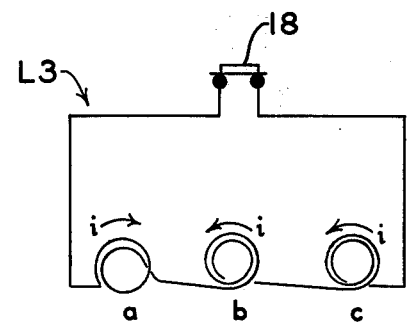

To accomplish this result, inductor $L_3$ comprises a nonsymmetrical coil as shown in FIG. 3 or at least three coupling coils in a nonsymmetrical arrangement as schematically and pictorially illustrated in FIGS. 6A and 6B respectively. The $L_3$ inductance is configured in a reverse figure eight comprising coils $a$ and $b$ for inverted coil coupling followed by an open loop comprising coils $b$ and $c$ for normal coupling wherein the same current $i$ flows through all segments of the $L_3$ structure. In this configuration, a close-circuited $L_3$ by virtue of a normal condition, or an $L_3$ that is arranged to close-circuit upon the occurrence of an abnormal condition, will affect the monitoring circuit regardless of its operational state, whether oscillating or nonoscillating, and proximate passage of the $L_3$ inductance will always generate a modulating pulse in the monitoring circuit 20.

Figure 5A:
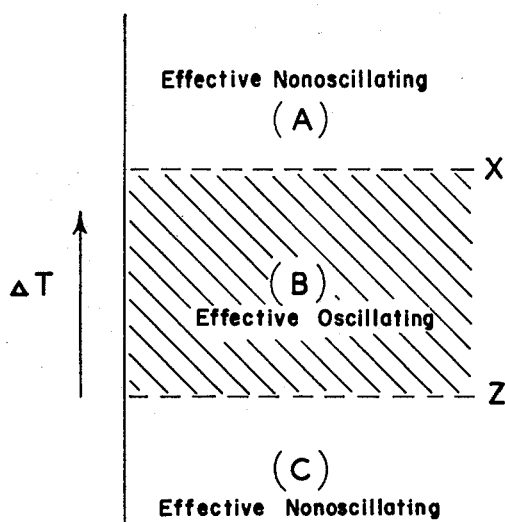
FIGS. 5A and 5B graphically illustrate the mode of operation of a temperature compensated monitoring circuit similar to that illustrated in FIG. 3.

It was herebefore mentioned that the change of state boundaries established by the X-axis and $F_b$ are dependent upon the variance in the monitoring circuit design parameters. In this respect, when temperature compensation is employed in the circuit as illustrated by the negative feedback ghost circuit of FIG. 3, amplification, hence sensitivity to the coupling between $L_1L_2$, exhibits a more varied response relative to temperature and the coupling may be at a minimum at some intermediate temperature. This results in two transition points or boundaries relative to temperature wherein the circuit passes from an oscillating to a nonoscillating state or vice versa when the coupling is near critical, rather than at a single boundary as herebefore described with respect to FIG. 4. This response may be illustrated as in FIG. 5A for the monitoring circuit absent an external coupling influence due to $L_3$, where the boundaries X and Z show the transition between an oscillating state as defined by region B and a nonoscillating state as defined by regions A or C.

Figure 5B:
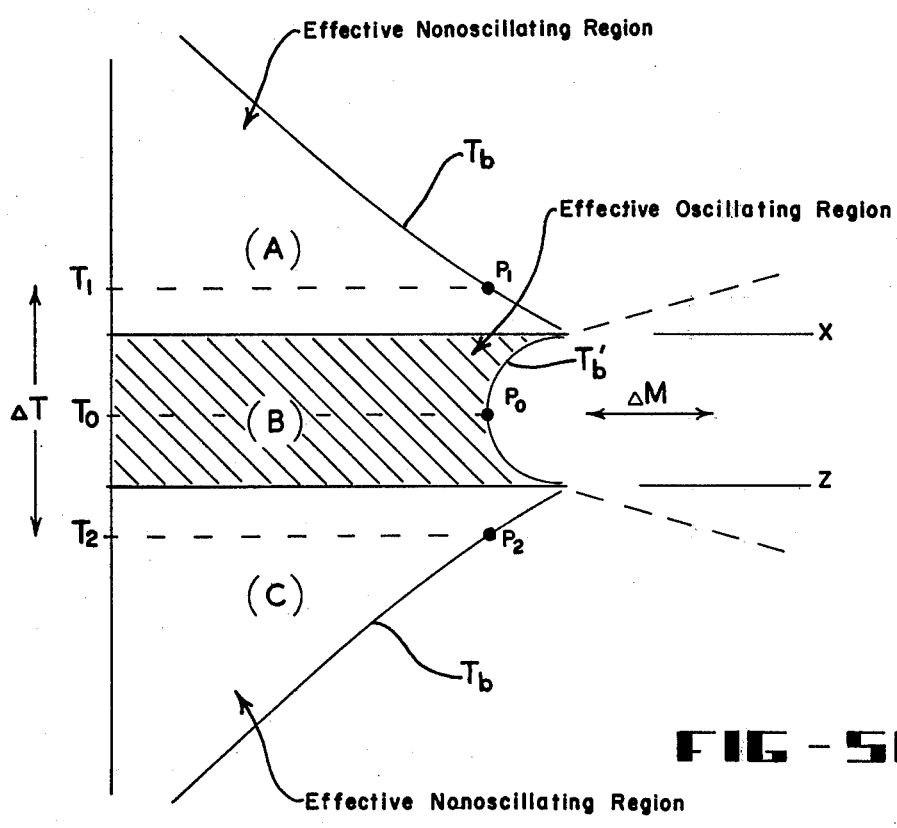

FIG. 5B graphically illustrates the case for a temperature compensated monitoring circuit when the external inductive influence of $L_3$ alters the coupling of $L_1L_2$. In the drawing, areas A and C describe the effective regions of nonoscillation while area B describes the effective region of oscillation. The X and Z axes are the transition boundaries for the circuit for changes in temperature $\Delta T$. If, for example, the temperature compensated monitoring circuit is operating at an initial temperature $T_o$, then it is operating in the region of oscillation absent the influence of inductor $L_3$. When inductor $L_3$ moves into proximity of the monitoring circuit such that the coupling distance approaches the change of state boundary $T_b'$, then the mutual coupling between the monitoring circuit inductors $L_1L_2$ is affected by the crossing of the boundary at $P_o$ and the circuit momentarily reverts to a nonoscillatory state. $\Delta T$ may change to $T_1$ or $T_2$ and it is readily apparent that the monitoring circuit is now in a nonoscillatory state and the proximate presence of $L_3$ crossing the change of state boundary $T_b$ at $P_1$ or $P_2$ respectively will cause the circuit to momentarily revert to an oscillatory state. In either case, a modulation pulse is generated in the monitoring circuit that may be utilized to provide an indication of the condition of the $L_3$ circuit.

While certain representative embodiments and details have been shown for the purpose of illustrating the invention, it will be apparent to those skilled in this art that various changes and modifications may be made therein without departing from the spirit and scope of the invention.

What is claimed is:

1. A monitoring system for sensing and indicating the occurrence of a change in condition of a first member moving relative to a second member comprising:
   A. circuit means on the second member responsive to a modulation pulse signal at its input to provide an indication of the normal and/or abnormal condition of the first member as determined by the presence or absence of a modulation signal;
   B. a monitoring circuit on the second member comprising an amplifier having input and output inductances, the amplifier configured to operate at a threshold of two operational states, the first state being such that the operational parameters of the circuit influence regenerative feedback over degenerative feedback and the amplifier oscillates while the second state is such that the circuit parameters influence degenerative feedback over regenerative feedback and the amplifier does not oscillate, said monitoring circuit coupled to the above mentioned circuit means to provide a modulation signal that will influence the status of the circuit means for indicating the change in condition; and C. an inductive sensor circuit on the first member, movable therewith and responsive to the occurrence of a change in the condition being monitored, said sensor circuit configured to provide intercoupling of the amplifier input and output inductances when close-circuited and in proximate position thereto such that a signal is generated in the monitoring circuit regardless of its current oscillatory or nonoscillatory operational state.

2. The system as set forth in claim 1 wherein the sensor circuit comprises:

a. a normally close-circuited switch adapted to being open-circuited upon a change in condition of the first member; and b. an inductive coil connected in series with the switch comprising a nonsymmetrical coil configuration that provides inverse coupling of the amplifier input and output inductances if the monitoring circuit is oscillating and provides increased normal positive coupling of the amplifier inductances if the monitoring circuit is not oscillating.

3. The system as set forth in claim 2 wherein the sensor circuit inductive coil comprises at least three coupling coils in a nonsymmetrical arrangement, the first and second of the coils in an inverted figure-eight configuration to effect coupling reversal of the amplifier inductors while the second and third of the coils are in an open loop configuration to effect normal positive loop coupling with the same current flowing through all segments of the sensor circuit.

4. The system as set forth in claim 2 wherein the switch is a pressure activated switch adapted to being open-circuited upon a change in a pressure condition.

5. The system as set forth in claim 4 wherein the system is applied to monitoring vehicle tire pressure.

6. The system as set forth in claim 2 wherein the system is applied to monitoring a continuous conveyor belt, the close-circuited switch being a conductive wire loop mounted transversely on the belt and adapted to being open-circuited upon the occurrence of damage to the belt.

7. The system as set forth in claim 1 wherein the amplifier is established at the threshold of either of the operational states by reason of an inductor in the feedback circuit of the amplifier.

8. The system as set forth in claim 2 wherein the switch is a temperature activated switch adapted to being open-circuited upon a change in a temperature condition on the moving member.

9. The system as set forth in claim 8 wherein the system is applied to monitoring the temperature of a vehicle tire.

10. A method of extending the operating range of a condition monitoring system for detecting the occurrence of an abnormal condition on a first member moving relative to a second member, the system comprising a sensor circuit on the moving member adapted to be responsive to the condition being monitored and a monitoring circuit on the second member adapted to being affected by the proximate presence of a close-circuited sensor circuit and providing detection signals to circuit means for indicating the monitored condition; the method comprising the steps of:

A. establishing the monitoring circuit in a configuration such that it is at the threshold of two possible operational states, the first state being such that the operational parameters of the circuit influence regenerative feedback over degenerative feedback and the circuit oscillates while the second state is such that the operational parameters influence degenerative feedback over regenerative feedback and the circuit does not oscillate; and B. providing a sensor circuit configuration that affects the monitoring circuit irrespective of its current oscillatory or nonoscillatory operational state.

11. The method as set forth in claim 10 wherein the monitoring circuit comprises an amplifier having input and output inductances and the sensor circuit comprises an inductance in series with a condition monitoring switch, said sensor circuit inductance comprising a nonsymmetrical coil configuration that provides inverse coupling of the amplifier input and output inductances if the amplifier is oscillating and provides increased positive coupling if the amplifier is not oscillating, the amplifier providing a modulation output pulse signal in response to a close-circuited sensor switch regardless in which operational state the amplifier happens to be.

12. The method as set forth in claim 11 wherein the monitoring circuit and the circuit means for indicating the monitored condition are mounted on a vehicle chassis and the sensor circuit is mounted on a vehicle wheel to monitor the pressure condition of a tire, said switch being close-circuited under a normal pressure condition and adapted to being open-circuited upon a drop in pressure to a predetermined limit.

* * * * *